(12) United States Patent
Sun et al.

(10) Patent No.: US 8,979,149 B2
(45) Date of Patent: Mar. 17, 2015

(54) DEVICE FOR GRASPING AND ACTIVE RELEASE OF MICRO AND NANO OBJECTS

(76) Inventors: Yu Sun, Toronto (CA); Brandon K. Chen, Mississauga (CA); Yong Zhang, Toronto (CA)

(\*) Notice: Subject to any disclaimer, the term of this patent is extended or adjusted under 35 U.S.C. 154(b) by 649 days.

(21) Appl. No.: 13/201,841

(22) PCT Filed: Feb. 17, 2009

(86) PCT No.: PCT/CA2009/000181
§ 371 (c)(1),
(2), (4) Date: Aug. 16, 2011

(87) PCT Pub. No.: WO2010/094102
PCT Pub. Date: Aug. 26, 2010

(65) Prior Publication Data
US 2011/0299969 A1    Dec. 8, 2011

(51) Int. Cl.
*B25J 7/00* (2006.01)
*B25J 15/12* (2006.01)
*B81C 99/00* (2010.01)

(52) U.S. Cl.
CPC .. *B25J 7/00* (2013.01); *B25J 15/12* (2013.01); *B81C 99/002* (2013.01); *B81C 2203/051* (2013.01); *Y10S 977/962* (2013.01)
USPC ........................................ 294/86.4; 977/962

(58) Field of Classification Search
CPC ............... B25J 7/00; B81B 2203/0136; B81B 2203/0118; B81B 2203/0307; B81C 99/002
USPC ........ 294/86.4, 99.1, 902; 310/300; 438/800; 977/962; 901/16, 36
See application file for complete search history.

(56) References Cited

U.S. PATENT DOCUMENTS

| | | | | |
|---|---|---|---|---|
| 4,667,997 A | \* | 5/1987 | Udagawa et al. | 294/86.4 |
| 5,046,773 A | \* | 9/1991 | Modesitt | 294/100 |
| 6,648,389 B2 | | 11/2003 | Frey | |
| 6,862,921 B2 | | 3/2005 | Chand | |
| 6,987,277 B2 | | 1/2006 | Baur | |
| 7,025,619 B2 | | 4/2006 | Tsui | |
| 7,261,352 B2 | | 8/2007 | Maslov | |
| 7,322,622 B2 | \* | 1/2008 | Hashiguchi et al. | 294/86.4 |
| 7,489,143 B2 | \* | 2/2009 | Konno et al. | 294/86.4 |
| 8,028,567 B2 | \* | 10/2011 | Kobayashi et al. | 73/105 |
| 8,623,222 B2 | \* | 1/2014 | Sun et al. | 216/2 |
| 2002/0061662 A1 | \* | 5/2002 | Boggild | 438/800 |

OTHER PUBLICATIONS

Fuchiwaki, Ohmi et al, Multi-axial Micromanipulation Organized by Versatile Micro Robots and Micro Tweezers, Proc. IEEE Int. Conf., Pasadena, CA, May 2008, pp. 893-898.

(Continued)

*Primary Examiner* — Paul T Chin
(74) *Attorney, Agent, or Firm* — Eduardo Krupnik; Miller Thomson LLP

(57) ABSTRACT

Micro-nanomanipulation device that is capable of grasping and actively releasing micro or nanometer-sized objects in ambient and vacuum environments as well as methods of manufacturing the devices of the present invention. The micro-nanomanipulation device includes gripping arms, an active release plunger to impact or push objects, and micro-actuators that actuate the gripping arms and the active release plunger.

13 Claims, 8 Drawing Sheets

(56) References Cited

OTHER PUBLICATIONS

Zesch, Wolfgang et al, Vacuum Tool for Handling Microobjects with a Nanorobot, Proc. IEEE Int. Conf. Robotics Automation, Albuquerque, NM, Apr. 1997, pp. 1761-1766.

Lopez-Walle, Beatriz et al, Principle of a Submerged Freeze Gripper for Microassembly, IEEE Transactions on Robotics, vol. 24, No. 4, Aug. 2008, pp. 897-902.

Fang, Y et al, Dynamic JKR Model with Application to Vibrational Release in Micromanipulation, Proc. IEEE/RSJ Int Conf Intelligent Robots & Systems, Beijing, China, Oct. 2006.

Saito, Shigeki et al, Kinematics of Mechanical and Adhesional Micromanipulation under a Scanning Electron Microscope, J. Appl. Phys. vol. 92, 2002, pp. 5140-5149.

Takahashi, Kunio et al, Voltage required to detach an adhered partical by Coulomb interaction for micromanipulation, J. Apps. Phys. vol. 90, Jul. 2001, pp. 432-437.

\* cited by examiner

☐ silicon
☐ silicon dioxide
☐ chromium and gold

SECTION A-A

DEVICE FOR GRASPING AND ACTIVE RELEASE OF MICRO AND NANO OBJECTS

CROSS REFERENCE TO RELATED APPLICATIONS

This application is a national stage application under 35 U.S.C. 371 of International Application No. PCT/CA2009/000181, filed Feb. 17, 2009, the contents of which is hereby incorporated by reference into the present disclosure.

FIELD OF THE INVENTION

The present invention relates to micro and nano manipulation, micro and nanotechnologies, and automation at the micro and nano scales.

BACKGROUND OF THE INVENTION

Among the challenges of micro/nano manipulation, a long-standing difficulty is the release of grasped objects from the end effector due to strong adhesion forces. Force scaling causes surface forces (i.e., adhesion forces) including the capillary force, electrostatic force, and van der Waals force to dominate volumetric forces (e.g., gravity). In the pursuit of rapid, accurate release methods, several strategies have thus far been proposed.

Alteration of surface adhesion property between pick and place allows a single needle probe to manipulate micro objects (O. Fuchiwaki, A. Ito, D. Misaki, and H. Aoyama, "Multi-axial micromanipulation organized by veratile micro robots and micro tweezers," in *Proc. IEEE Int. Conf. Robotics Automation*, Pasadena, Calif., USA, May 2008, pp. 893-898). This method relies on UV-cured adhesive applied onto a substrate for object release.

Rolling movements of a single needle probe were used to manipulate the adhesional forces between pick and release, and had successfully constructed a diamond-shaped structure using microspheres (S. Saito, H. T. Miyazaki, T. Sato, and K. Takahashi, "Kinematics of mechanical and adhesional micromanipulation under a scanning electron microscope," *J. Appl. Phys.*, vol. 92, pp. 5140-5149, 2002). The method proposed by Saito et al, however, requires a highly skilled operator to execute complex motions and relies on trial-error processes.

Active release methods that do not rely on substrate adhesion properties for release were also proposed. Electric field created by substrate—probe potential difference was used to detach the object from the probe (K. Takahashi, H. Kajihara, M. Urago, S. Saito, Y. Mochimaru, and T. Onzawa, "Voltage required to detach an adhered particle by coulomb interaction for micromanipulation," *J. Appl. Phys.*, vol. 90, pp. 432-437, 2001). This method, however, requires the substrate, probe, and object to be electrically conductive.

Vacuum based method creates pressure differences between pick and place (W. Zesch, M. Bmnner, and A. Weber, "Vacuum tool for handling micro objects with a nano robot," in Proc. IEEE Int. Conf. Robotics Automation, Albuquerque, N. Mex., USA, April 1997, pp. 1761-1766). This method, however, is not suitable for use within a vacuum environment such as inside the SEM (scanning electron microscope), which limits its ability to manipulate sub-micrometer objects.

Micro peltier coolers were used to form ice droplets instantaneously for picking up micro objects, and thawing the ice droplets to release objects (B. López-Walle, M. Gauthier, and N. Chaillet, "Principle of a sub-merged freeze gripper for microassembly," IEEE Transactions on Robotics, vol. 24, pp. 897-902, 2008). The manipulation disclosed by López-Walle et al, however, must take place in an aqueous environment.

U.S. Pat. No. 6,987,277 discloses a method for pick and place of nano objects by selectively activating spots on a passivated substrate using a scanning probe microscope tip, then release the nano objects onto the activated spots using chemical and physical binding forces. This manipulation process requires specially treated sample and substrate.

U.S. Pat. No. 6,648,389 discloses a vibration-based release microgripper for pick and release. The fabrication process of the microgripper limits its scaling down capability, and the release accuracy is poor, as described in a similar, vibration-based design (Y. Fang and X. Tan, "A dynamic jkr model with application to vibration release in micromanipulation," in *Proc. IEEE/RSJ Int. Conf. Intelligent Robots and Systems*, Beijing, China, October 2006, pp. 1341-1345).

U.S. Pat. No. 7,025,619 discloses the use of mechanical sockets for locking two micro components together for assembly. This method requires each component to have a specially designed mechanical junction for assembly.

While several patented microgripper designs exist, they only focus on the grasping capability. There are no known gripper designs that are capable of reliable release. For example, U.S. Pat. No. 6,862,921 (Veeco Instruments Inc.) discloses the use of two scanning probe microscope tips that are used in combination to form tweezers for manipulation; U.S. Pat. No. 7,261,352 (Samsung Electronic Co., Ltd) discloses a carbon nanotube gripping device. Other companies that specialize in micro and nanotechnologies, such as Zyvex or Nascatec, have commercialized different types of microgrippers and probes capable of picking up objects, but all lack release mechanisms.

Besides the lack of release capabilities in existing designs, existing designs also have limited down scaling capabilities. To manipulate nanometer-sized objects, the manipulation tip of the device ideally should have a comparable size to the object. This is difficult to accomplish in most fabrication processes for MEMS-based (microelectromechanical systems) microgrippers, where all structural features in the device typically have the same thickness. By reducing the device thickness, the performance of the microactuator is greatly reduced due to decreased overlapping areas or volume; and the poor aspect ratio in flexures produces undesired motions during operation. While down scaling is easy to achieve with a needle probe, the pick-up capability of needle probes is very limited.

In summary, the lack of highly repeatable and accurate release methods limits efficient, automated micro and nano manipulation, which is important for in situ sample preparation and handling as well as for the construction of micro and nano structures/devices. What is needed is a gripper design that permits (1) easy, secured grasping of micro, nanometer-sized objects; (2) rapid, highly reproducible, accurate release of the objects; and (3) ready down scaling for manipulating sub-micrometer and nanometer sized objects.

SUMMARY OF INVENTION

In one aspect of the present invention, a device capable of grasping nanometer or micrometer sized objects and performing active release of the objects is provided.

In another aspect of the present invention, a method of manufacturing a device for grasping objects and performing active release of said objects is provided.

As such, in one aspect, the present invention is a device for manipulating nanometer-scale sized objects or micrometer-scale sized objects, characterized in that the device comprises:
(a) gripping arms for grasping the objects;
(b) a release plunger for actively releasing the objects from gripping arms; and
(c) microactuation means connected to the gripping arms and the release plunger and operable to actuate the gripping arms and said release plunger to grasp and actively release the objects from the gripping arms.

In yet another aspect, the present invention is a method of manufacturing a device for manipulating nanometer-scale sized objects or micrometer-scale sized objects, said device comprising structural elements, said structural elements including gripping arms for grasping the objects, a release plunger for actively releasing the objects from gripping arms, and microactuation means connected to the gripping arms and the release plunger and operable to actuate the gripping arms and said release plunger to grasp and actively release the objects from the gripping arms, characterized in that said method comprises the following steps:
(a) providing a wafer having a top side and a bottom side, said wafer comprising a top layer, a middle layer and a bottom layer, wherein said layers are made of materials having a suitable etch selectivity;
(b) patterning etching the top layer into a desired final pattern of the top layer corresponding to the device;
(c) etching from the top side exposed areas of the middle layer until the bottom layer; and
(d) etching from the top side exposed areas of the bottom layer, thereby providing the device for manipulating the objects.

In a further aspect, the present invention is a method of manufacturing a device for manipulating nanometer-scale sized objects or micrometer-scale sized objects, said device comprising structural elements, said structural elements including gripping arms for grasping the objects, a release plunger for actively releasing the objects from gripping arms, and microactuation means connected to the gripping arms and the release plunger and operable to actuate the gripping arms and said release plunger to grasp and actively release the objects from the gripping arms, wherein the gripping arms comprise gripping tips having a thickness and wherein said method is capable of selectively reducing the thickness of said tips with respect to the structural elements, characterized in that the method comprises the following steps:
(a) providing a wafer having a top side and a bottom side, said wafer comprising a top layer, a middle layer and a bottom layer, wherein said layers are made of materials having a suitable etch selectivity;
(b) patterning etching the top layer into a desired final pattern of the top layer corresponding to the device;
(c) applying onto the top layer a photoresist mask, and pattern said mask into a desired final pattern of the middle layer corresponding to the structural elements of the device;
(d) etching from the top side exposed areas of the middle layer until the bottom layer;
(e) etching from the top side exposed areas of the top layer and the bottom layer; and
(f) etching from the top side exposed areas of the middle layer, thereby providing the device comprising gripping tips having their thickness reduced with respect to the structural elements.

In yet another aspect, the present invention is a method of manufacturing a device for manipulating nanometer-scale sized objects or micrometer-scale sized objects, said device comprising structural elements, said structural elements including gripping arms for grasping the objects, a release plunger for actively releasing the objects from gripping arms, and microactuation means connected to the gripping arms and the release plunger and operable to actuate the gripping arms and said release plunger to grasp and actively release the objects from the gripping arms, characterized in that said method comprises patterning etching a silicon-on-insulator wafer from a single side of said wafer.

In yet a further aspect, the present invention is a microfabrication method enabling the patterning of two layers of materials from a single side of a wafer in order to manufacture a device for manipulating nanometer-scale sized objects or micrometer-scale sized objects, said device comprising high-aspect-ratio structures and low-aspect-ratio structures, characterized in that said method comprises the following steps:
(a) providing a wafer having a top side and a bottom side, said wafer comprising a top layer, a middle layer and a bottom layer, wherein said layers are made of materials having a suitable etch selectivity;
(b) patterning etching the top layer into a desired final pattern of the top layer corresponding to the device;
(c) applying onto the top layer a photoresist mask, and pattern said mask into a desired final pattern of the middle layer corresponding to the high-aspect-ratio structures of the device;
(d) etching from the top side the exposed areas of the middle layer until the bottom layer;
(e) etching from the top side the exposed areas of the top layer and the bottom layer;
(f) etching from the top side the exposed areas of the middle layer, thereby forming the low-aspect-ratio structures of the device.

In a further aspect yet, the present invention is a method for grasping and placing an object to a desired target area with the use of a device capable of manipulating nanometer-scale sized objects or micrometer-scale sized objects, said device comprising gripping arms capable of opening and closing around the object, a release plunger for actively releasing the object from the gripping arms, and microactuation means connected to the gripping arms and the plunger and operable to actuate said gripping arms and release plunger, characterized in that said method comprises the following steps:
(a) closing the gripping arms around the object to grasp;
(b) moving the device to lift the object up and transport the object to the desired target area;
(c) opening the gripping arms; and
(d) activating the plunger to actively release the object attached by adhesion forces to an arm of the gripping arms thereby placing the object on the target area.

In another aspect of the present invention, integrated, single-chip, batch microfabricated MEMS devices are disclosed that are electrostatically or electrothermally driven grippers for grasping micrometer or nanometer sized objects with two independently actuated gripping arms and an integrated plunger for active release of the objects. The plunger is capable of impacting or pushing the objects and allows the adhered objects to gain sufficient momentum to overcome the adhesion forces and enables release on demand.

Advantages of the present invention include a device for grasping and actively releasing objects having a design that permits (1) easy, secured grasping of micro or nanometer-sized objects; (2) rapid, highly reproducible, accurate release of the objects in target areas; and (3) precise down scaling of the microgripping tip for manipulating sub-micrometer and nanometer sized objects.

BRIEF DESCRIPTION OF THE DRAWINGS

A detailed description of one or more embodiments is provided herein below by way of example only and with reference to the following drawings, in which.

Figure 1:
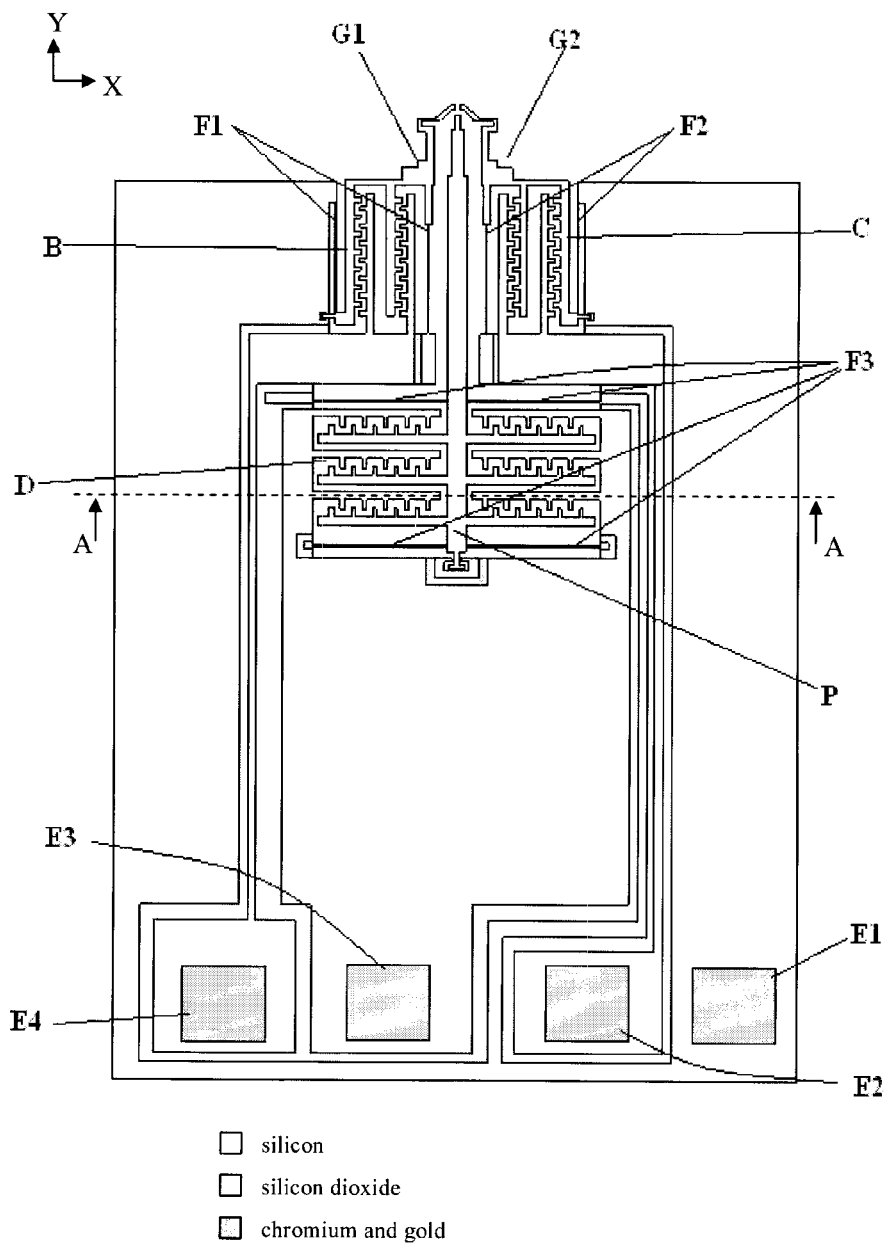
FIG. 1 illustrates a gripper with integrated active release plunger.

In the drawings, one or more embodiments of the present invention are illustrated by way of example. It is to be expressly understood that the description and drawings are only for the purpose of illustration and as an aid for understanding, and are not intended as a definition of the limits of the present invention.

DETAILED DESCRIPTION OF THE INVENTION

The present invention provides a device comprising an active release plunger capable of highly repeatable, accurate pick and place of micro and nanometer-sized objects. In particular, the present invention overcomes the drawbacks of existing designs (i.e., release and down scaling) and provides a micro-nanomanipulation tool that can grasp and release objects on demand, and can be readily down scaled through a new microfabrication process.

Thus, in one aspect the present invention is a device for manipulating nanometer-scale sized objects or micrometer-scale sized objects, characterized in that the device comprises:
(a) gripping arms for grasping the objects;
(b) a release plunger for actively releasing the objects from gripping arms; and
(c) microactuation means connected to the gripping arms and the release plunger and operable to actuate the gripping arms and said release plunger to grasp and actively release the objects from the gripping arms.

In another aspect, a novel microfabrication method is described, enabling the patterning of two layers of materials from a single side of a wafer. This microfabrication method can be integrated into most standard microfabrication processes that involve multi-layered wafers (e.g., silicon-on-insulator wafer) in order to construct devices with both high-aspect-ratio structures and thin end structures. In the context of devices for micromanipulating nano-scale sized objects, this microfabrication method permits the construction of devices with both high-aspect-ratio structures and low aspect ratio structures with a thickness that is comparable to nanometer-sized objects to be manipulated. Thus, in yet another aspect, the present invention is a method of manufacturing a device for manipulation of nano-scale sized objects comprising high-aspect-ratio structures and low-aspect-ratio structures, characterized in that said method comprises:
(a) providing a wafer having a top side and a bottom side, said wafer comprising a top layer, a middle layer and a bottom layer, wherein said layers are made of materials having a suitable etch selectivity;
(b) patterning etching the top layer into a desired final pattern of the top layer corresponding to the device;
(c) applying onto the top layer a photoresist mask, and pattern said mask into a desired final pattern of the middle layer corresponding to the high-aspect-ratio structures of the device;
(d) etching from the top side the exposed areas of the middle layer until the bottom layer;
(e) etching from the top side the exposed areas of the top layer and the bottom layer;
(f) etching from the top side the exposed areas of the middle layer, thereby forming the low-aspect-ratio structures of the device.

In yet another aspect, the present invention is a method for grasping and placing an object to a desired target area with the use of a device capable of manipulating nanometer-scale sized objects and micrometer-scale sized objects, said device comprising gripping arms capable of opening and closing around the object, a release plunger for actively releasing the object from the gripping arms, and microactuation means connected to the gripping arms and the plunger and operable to actuate said gripping arms and release plunger, characterized in that said method comprises the following steps:
(a) closing the gripping arms around the object to grasp;
(b) moving the device to lift the object up and transport the object to the desired target area;
(c) opening the gripping arms; and
(d) activating the plunger to actively release the object attached by adhesion forces to an arm of the gripping arms thereby placing the object on the target area Manipulation in the context of this invention means to perform displacement and assembly tasks on nano-scale or micro-scale objects, including, without limitation, grasping, lifting, pushing, releasing and injecting nano-scale or micro-scale objects.

Figure 2:
FIG. 2 is a cross-sectional view of the gripper corresponding to FIG. 1 along axis A-A.

FIGS. 1 and 2 illustrate one embodiment of the grasping and active releasing device of the present invention. In this embodiment the grasping and active releasing device comprises an electrostatically actuated microgipper comprising of three parts: (i) two electrostatic comb-drive microactuators B and C each controlling one of the two gripping arms G1 and G2 for grasping and gripper-plunger alignment; (ii) electrostatic comb-drive actuator D controlling active release plunger; and (iii) Linear beam flexures F1, F2 and F3 used to transform actuated forces into displacements.

In the embodiments of FIGS. 1 and 2, the gripper and the plunger are actuated by lateral comb-drive microactuators. However, it should be understood that other types of electrostatic actuators, electrothermal actuators, or other types of microactuators in combination with motion/force amplification/reduction mechanisms are possible and within the scope of the present invention.

Lateral comb-drive microactuators are ideal for micro-nanomanipulation due to its high bandwidth, high motion resolution, no temperature gradient, ease to implement, and adequate force output to overcome surface adhesion forces. By changing the dimensions of the flexure F1, F2 and F3 or the dimensions of comb-drive B, C and D, the motion range and resolution of the actuators can be adjusted.

Comb-drive microactuator B produces forces to deflect flexures F1. The linear motion is directly transferred to the gripping arm G1. The second gripping arm G2 connected to microactuator C through flexure F2 has a symmetrical configuration. The gripping arms are individually controlled by applying voltage between electrode E2 and E1, or E4 and E1. The gripping tip separation determines the suitable size of the object to be grasped.

The active release plunger P is controlled by applying a voltage between electrode E3 and E1, where the forces produced by the comb-drive microactuator deflect flexures F3 and produce linear motions. The four tethered flexures F3 minimize out-of-plane motion in the x-y plane, relative to the plunger tip.

The active release plunger may be used in different ways. To achieve a substrate independent release, a sharp increase in the actuation voltage will allow the plunger P to move at a high speed and collide with the object adhered to one of the gripping arms G1 or G2. The impact allows the adhered object to gain sufficient momentum to overcome the adhesion forces between the object and a gripping arm, resulting in release. In the case when the plunger moves at a relatively low speed, the adhered object can be pushed off from the gripping arm and directly into the substrate; however, the success in release depends on adhesion force differences between the plunger-object and the object-substrate contact surfaces. When a plunger is extended beyond the gripping arm tip, it can also function as a needle probe for manipulation.

Different actuation voltage rising profiles result in different plunger speed and force. One particular experiments on ~10 μm sized microspheres demonstrated that a sharp increase in actuation voltage results in guarantee release. Quantification of maximum plunging speed using high-speed videography (13000 frames per second) reveals a plunging speed of 65.24 mm/s produces a microsphere speed of 105.01 mm/s. A high plunging speed alleviates careful sample preparation requirements (e.g., baking) or environmental control requirements (e.g., humidity).

Figure 3:
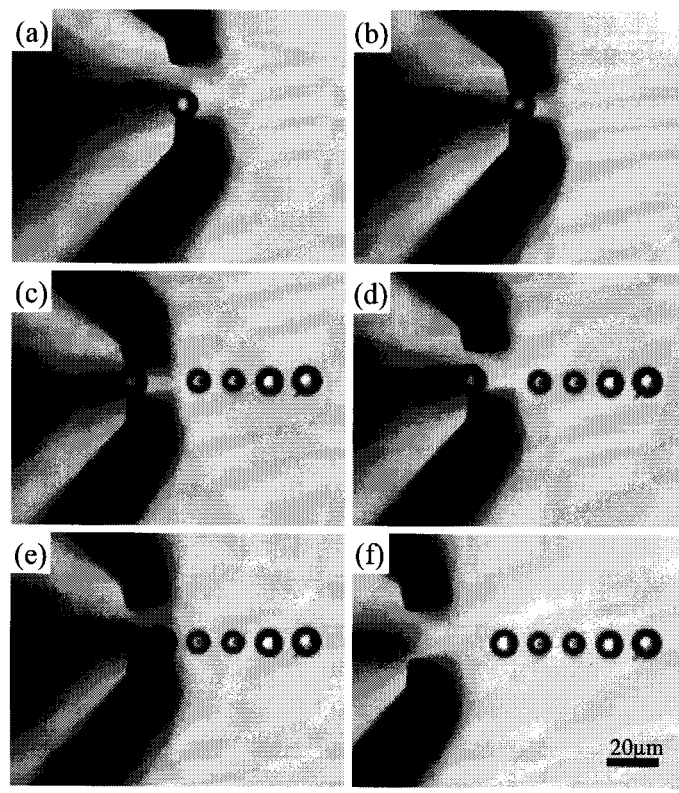
FIG. 3 illustrates an example of pick-place sequence using an embodiment of the present invention.

FIG. 3 illustrates an example of micromanipulation sequence of microspheres using a high speed plunger, (a) the microgripper approaches a microsphere and may use one gripping arm to laterally push it to break the initial adhesion bond between the microsphere and the substrate. (b) Two gripping arms are closed, grasping the microsphere and lifting it up. (c) The microsphere is transported to the target area and positioned a minimum distance above the substrate. (d) The gripping arms are opened and the gripping arm that the microsphere adheres to positions the microsphere properly to the right position in relation to the plunger. (e) The plunger thrusts out the microsphere that lands accurately on the substrate. (f) Microgripper retracts to repeat the pick-place process.

Figure 4:
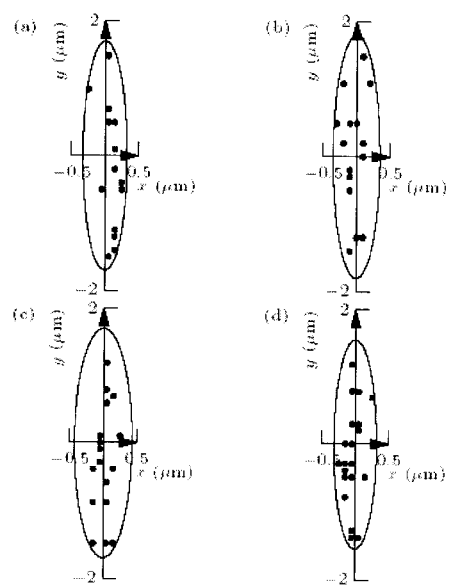
FIG. 4 shows the experimental landing result of 10 μm microspheres with the use of active release plunger, proving an accuracy better than 18% of micro object size.

The landing accuracy is inversely proportional to the height of the gripping arms and plunger above the substrate. To achieve a high accuracy, the microgripper should be placed at a small distance above the destination. Using a high speed plunger, the micro object is separated from the plunger upon impact, hence the release capability is independent of the substrate. Note that the term substrate herein refers to any surface for object to be released on, including on top of another object such as during the construction of three-dimensional structures. FIG. 4 shows representative experimental accuracy results for active release of 10 μm microspheres from 2 μm above the substrate.

The release accuracy in this particular setup is 0.7±0.46 μm. Since the positioning system had a ~1 μm precision/repeatability and the environmental parameters were not strictly controlled, the release accuracy of the technique alone is expected to be better than a few hundreds of nanometers.

This intuitive active release design is the first-of-its-kind to allow a micro-nanometer-sized object to be picked up and released in both ambient and vacuum environments. In aspects of this invention, the objects' size range from about 1 nm to about 500 μm. This new tool can find a range of applications. For example, physical modification and dissection a biology cell in electron microscopes for cytology research, and automated operation to construct three-dimensional novel micro-nano structures under optical and electron microscopes.

Figure 5:
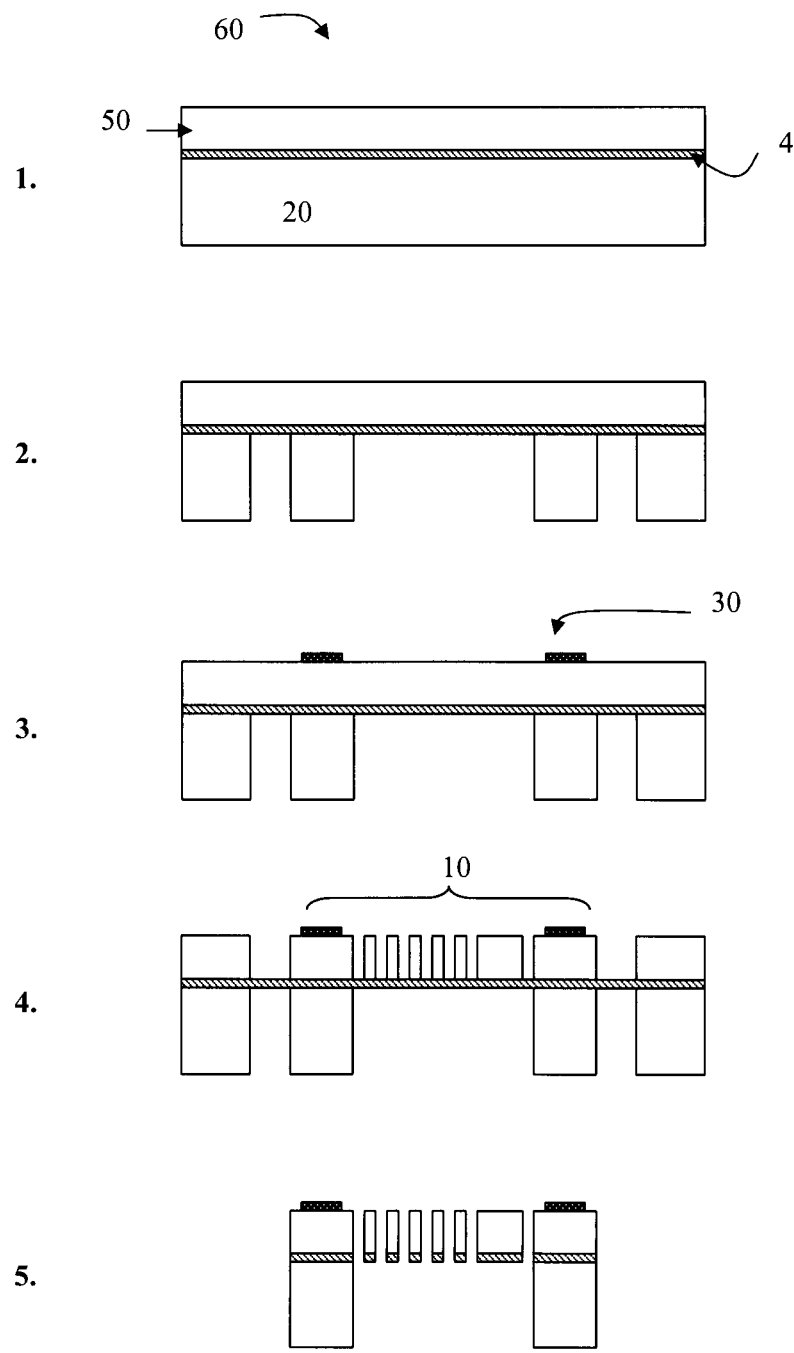
FIG. 5 illustrates fabrication process A.
Figure 7:
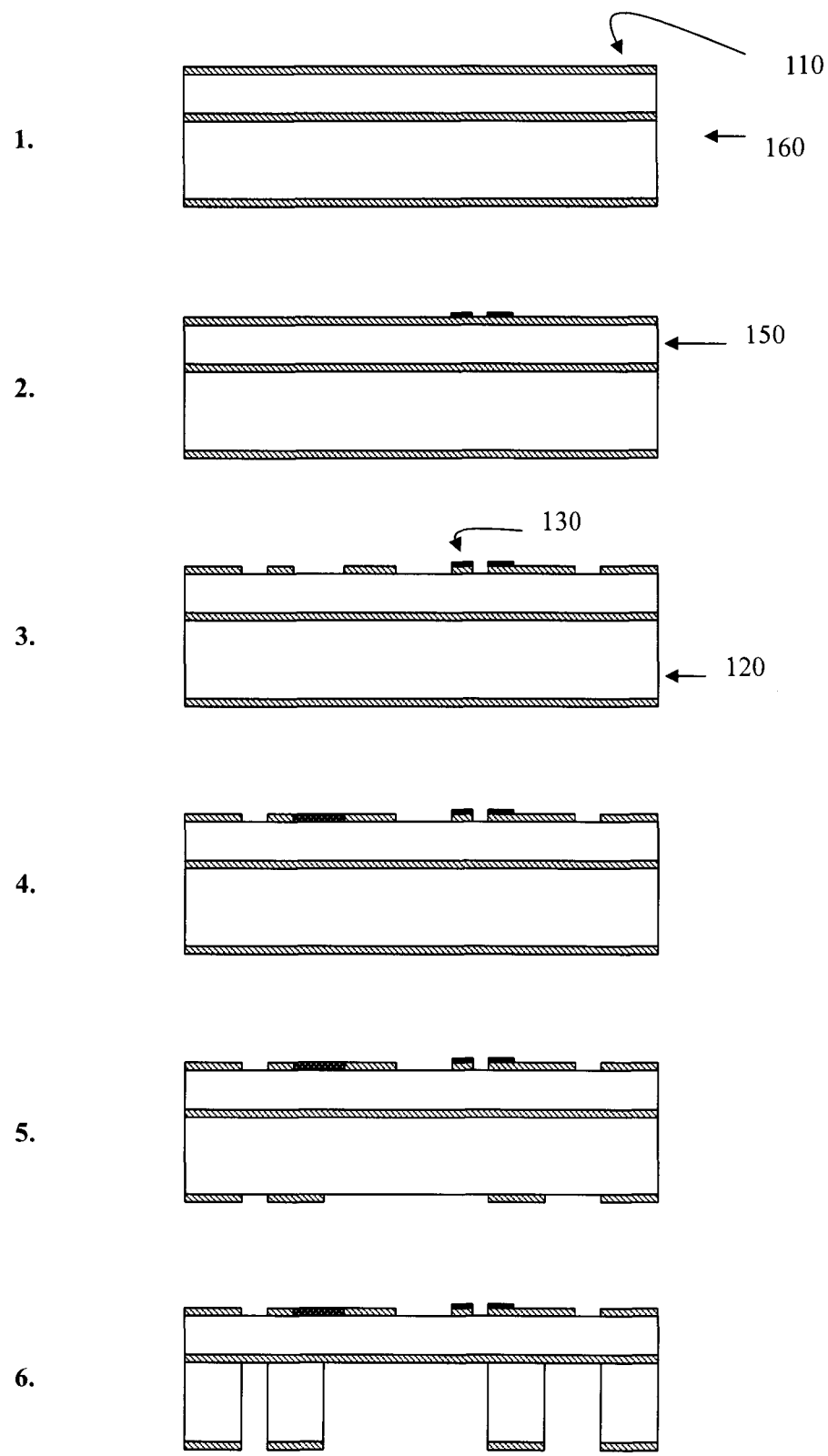
FIG. 7 illustrates fabrication process B.
Figure 7:
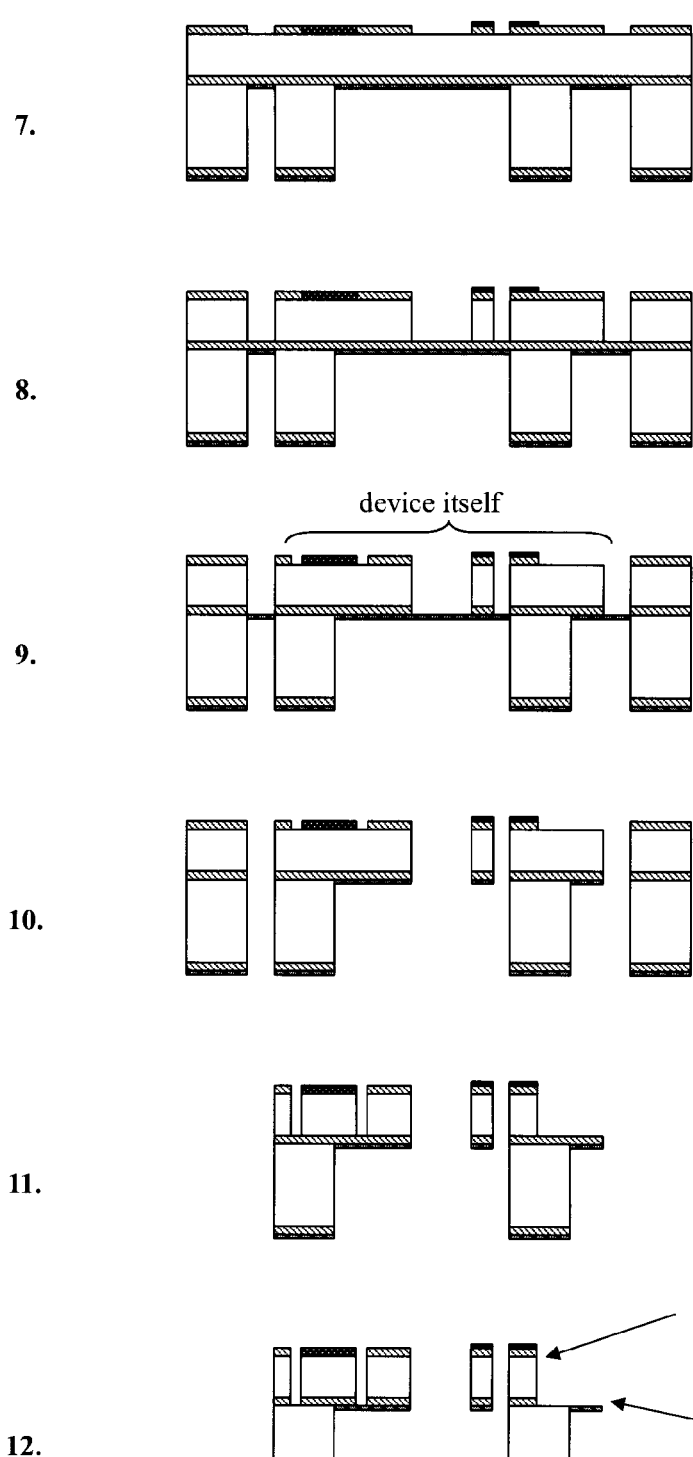

Two fabrication processes for forming the devices of the present invention are illustrated in FIG. 5 and FIG. 7. FIG. 5 shows microfabrication process (A) for devices capable of micromanipulating objects down to ~1 μm. FIG. 7 shows a modified fabrication process (B) for devices capable of nanomanipulating sub-micrometer and nanometer-sized objects. Both processes use an SOI (silicon-on-insulator) wafer. Suitable SOI wafers for both microfabrication processes include SOI wafers having a 200-500 μm thick silicon handle layer, a 0.1-2 μm thick of a buried insulating layer, such as a $SiO_2$ box layer, and a 10-300 μm thick silicon device layer.

Steps for process (A) include:
1. Start with an SOI wafer 60.
2. Handle layer 20 of the wafer 60 is etched using, for example, DRIE (deep reactive ion etching) until the buried oxide layer 40 (photolithographic mask 1).
3. Ohmic contacts 30 are formed by e-beam evaporation and patterned by lift-off (photolithographic mask 2).
4. Device layer 50 is patterned using photolithographic mask 3, and then etched using DRIE until the BOX (buried oxide) layer.
5. $SiO_2$ BOX layer is etched and the individual devices 10 are released from wafer 60.

To manipulate nanometer-sized objects, the gripping tip ideally should have a comparable thickness to the object. Based on standard SOI fabrication processes, microgrippers produced by process (A) can only be scaled down by reducing the thickness of the whole device, which induces problems such as undesired out-of-plane motion resulting from poor aspect ratio in flexures; reduced microactuator performance; and reduced device structural integrity.

To overcome the problems associated with reducing the thickness of the whole device, it is ideal to selectively reduce only the thickness of the gripping tips while maintaining the thick structure for the rest of the device. This can be conceptually achieved on a silicon wafer with a thin oxide layer on top. The oxide layer forms the gripping tip structure and the silicon layer forms the rest of the device structures. However, a device created in this manner cannot be more than a couple of hundred micrometers thick, making it difficult to handle without device breakage. To overcome the device handling issue, an SOI wafer can be conveniently used to provide an additional handling layer for structural support.

Figure 6:
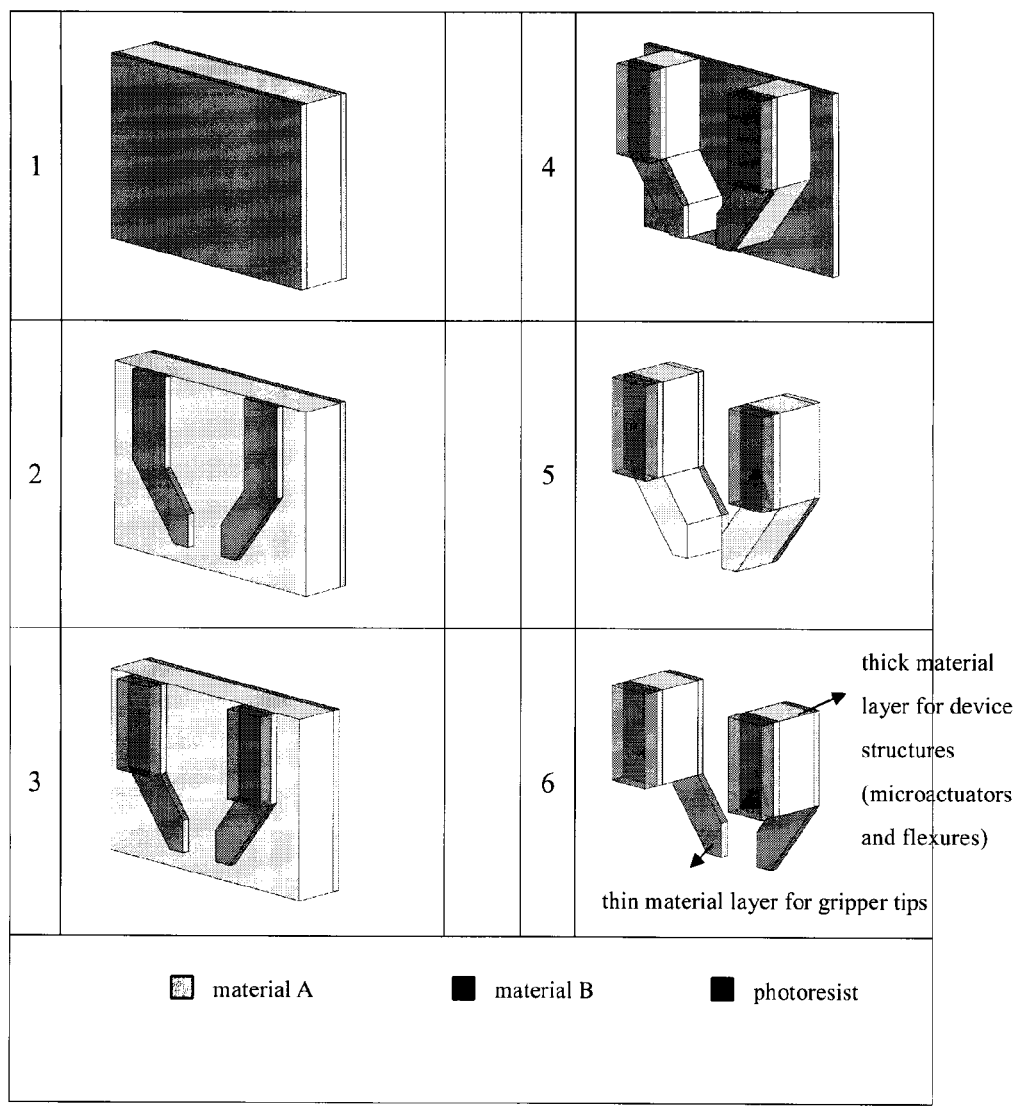
FIG. 6 illustrates a general fabrication process.

For a wafer with more than two material layers (e.g., an SOI wafer has three layers—device silicon layer, buried oxide layer, and handle silicon layer), no standard, existing microfabrication processes are able to form different patterns on each layer. The present invention describes a novel general fabrication process that enables the patterning of two layers of materials from a single side of a wafer, as shown in FIG. 6 and described below. In the case of an SOI wafer, this new process allows the buried oxide layer to be patterned differently from the device silicon layer and be patterned to form thin gripping tips for manipulating sub-micrometer and nanometer sized objects. This new process allows wafers with up to four different material layers to be patterned separately using conventional micromachining processes.

Using a general example to describe the general process, a wafer with two material layers, layer A (top) and layer B (bottom), can both be patterned from a single side of the wafer through the following steps (FIG. 6):
1. Deposit a layer of material B onto layer A as etch mask.
2. Pattern the deposited layer into final desired pattern of layer B.
3. Pattern a mask photoresist on deposited layer B into final desired pattern of layer A.
4. Etch exposed material A from top.
5. Etch exposed material B from top.
6. Etch exposed material A from top.

The working conditions for process (X) include:
1. Suitable etching methods are available for etching materials A and B.
2. Materials A and B have suitable etch selectivity, such as between Silicon and SiO2
3. Photoresist can withstand etching of both material A and B.

By integrating this novel fabrication process (X) into process (A), with reference to FIG. 7, where A is the device silicon layer and material B is the BOX layer of an SOI wafer, the new microfabrication process (B) includes the following steps:
1. A material 110 having a preselected electrical resistivity, such as $SiO_2$, is thermally grown on both sides of an SOI wafer 160.
2. Chromium is evaporated onto device layer 150, and patterned to define features such as comb fingers and flexures (photolithographic mask 1).
3. Top $SiO_2$ layer is etched with RIE (reactive ion etching) using photolithographic mask 2 and predefined Cr etch mask.
4. Ohmic contacts 130 are formed by e-beam evaporation and patterned by lift-off (mask 3).
5. Bottom $SiO_2$ layer is patterned to form DRIE (deep reactive ion etching) etch mask on handle layer. (mask 4)
6. Handle layer 120 is etched using DRIE until $SiO_2$ BOX layer.
7. A thin film of a material having a predetermined electrical conductivity (metal/non-metal) is evaporated onto the handle layer.
8. Device layer 150 is patterned using photolithographic mask 5. Then the exposed silicon is etched using DRIE.
9. Exposed $SiO_2$ from both top layer and BOX layer are etched from the top.
10. Exposed metal/non-metal thin film is etched using RIE from the top.
11. Exposed device layer silicon is etched using DRIE from the top.
12. (optional depending on needs) Exposed $SiO_2$ from top layer and BOX layer are etched away from the top to expose metal/non-metal thin film at gripping tip.

The general process illustrated in FIG. 7 is integrated into process (B) as steps 1, 3, 8, 9, and 11, permitting the device silicon layer to be patterned into device structures (microactuators and flexures), and the BOX layer to be patterned into gripping tips. Through the integration of the general process with process (A), it is now possible to selectively reduce the gripping tip thickness to sub-micrometers for manipulating nanometer sized objects.

Due to the increased complexity in fabrication sequence, step 2 in process (B) was added to minimize alignment issues with small features.

Depending on the application requirement, process B allows the gripping tip to be made from a broad range of materials, conductive or non-conductive (determined by Process B, step 7). When the gripping is used upside down inside an SEM (scanning electron microscope), the deposited thin film (Process B, step 7) can also prevent charging effect and provide clearer images. The working environment for this type of grippers includes ambient and vacuum environments.

Figure 8:
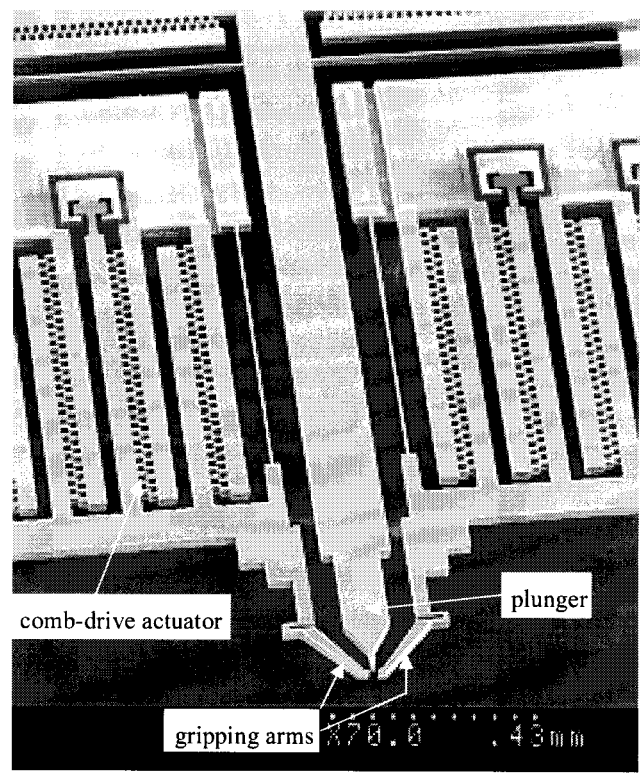
FIG. 8 shows an SEM image of the microgripper with active release plunger fabricated using Process (A)
Figure 9:
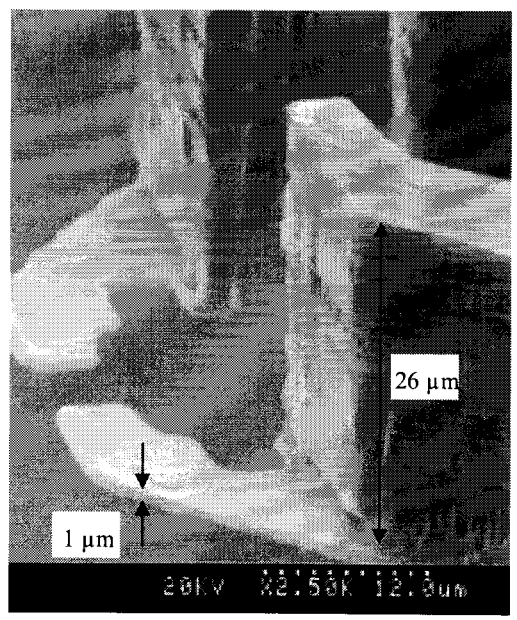
FIG. 9 shows an SEM image of the gripper tip fabricated using Process (B). The labelled dimensions illustrate the difference in thickness between the gripper tip vs. the rest of the structure.
Figure 10:
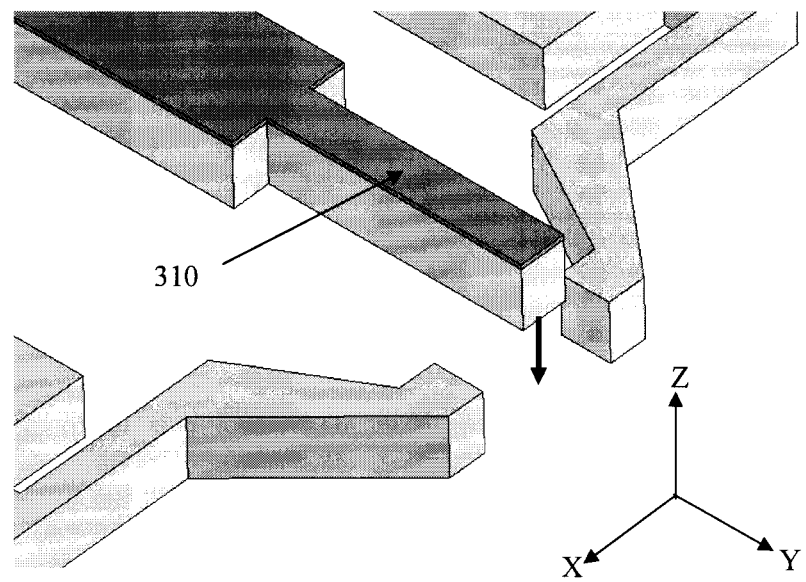
FIG. 10 shows an alternative configuration of active release mechanism where bimorph microactuator is used.

FIG. 8 shows an SEM image of an example gripper with a plunger for active release fabricated using Process (A). The device is suitable for micromanipulation of objects down to about 1 µm in size. FIG. 9 shows an SEM image of an example gripper with a plunger for active release fabricated using Process (B). The device is suitable for nanomanipulation of objects smaller than about 1 µm in size.

It should be understood that the present invention is the first-of-its-kind in terms of active release repeatability and accuracy. The present invention is also the first-of-its-kind to allow precise thickness control over the microgripper tip without changing the thickness of device layer, through the integration of a novel fabrication process (X) into fabrication process (A).

The above descriptions relate to active release through in-plane motions of a plunger. An alternative configuration for active release is to replace the microactuator D in FIG. 1 with an out-of-plane microactuator. For example, the plunger can be replaced by a thermal bimorph microactuator, as shown in FIG. 9. The top layer 310 comprises a deposited material with higher thermal expansion coefficient than the bottom layer. When heat is generated, the difference in thermal coefficients will drive the tip of the plunger in the direction indicated by the arrow (negative Z direction), releasing an adhered object through the out-of-plane motion from the plunger.

It will be appreciated by those skilled in the art that other variations of the one or more embodiments described herein are possible and may be practiced without departing from the scope of the present invention.

The invention claimed is:

1. A micro-nanomanipulation device for manipulating nanometer-sized objects or micrometer-sized objects, wherein the device comprises:
   (a) gripping arms for grasping the objects;
   (b) a movable active release plunger to impact or push the objects adhered to the gripping arms; and
   (c) microactuation means connected to the gripping arms and the active release plunger, said microactuation means being operable to actuate the gripping arms to grasp the objects and to actuate said movable active release plunger to actively release the objects from the gripping arms.

2. The device of claim 1, wherein said microactuation means include electrostatic microactuators, electrothermal microactuators or piezoelectric actuators.

3. The micro-nanomanipulation device of claim 1, wherein the device is operable to grasp and actively release objects ranging in size from about 1 nm to about 500 µm.

4. The micro-nanomanipulation device of claim 1, wherein the release plunger is operable to produce variable plunging speeds and forces.

5. The micro-nanomanipulation device of claim 1, wherein said microactuation means comprise a first set of microactuators connected to the gripping arms and a second set of microactuators connected to the release plunger.

6. The micro-nanomanipulation device of claim 5, wherein the second set of microactuators comprise in-plane microactuators that permit the plunger to impact the object from an in-plane direction; or the second set of microactuators comprise out-of-plane microactuators that permit the plunger to impact the object from an out-of-plane direction.

7. The micro-nanomanipulation device of claim 5, wherein the first set of microactuators comprise microactuators independently connected to each arm of the gripping arms.

8. The micro-nanomanipulation device of claim 1, wherein the gripping arms and the plunger are connected to the microactuation means by flexures.

9. The micro-nanomanipulation device of claim 1, wherein said plunger further functions as a probe for direct manipulation of the objects.

10. A method of manufacturing a device for manipulating micrometer-sized objects, said device comprising structural elements, said structural elements including gripping arms for grasping the objects, a movable active release plunger to impact or push objects adhered to the gripping arms, and microactuation means connected to the gripping arms and the active release plunger and operable to actuate the gripping arms to grasp objects and to actuate said active release plunger to actively release the objects from the gripping arms, characterized in that said method comprises the following steps:
(a) providing a wafer having a top side and a bottom side, said wafer comprising a top layer, a middle layer and a bottom layer, wherein said layers are made of materials having a suitable etch selectivity;
(b) etching the bottom layer, thereby exposing selected areas of the middle layer;
(c) etching the top layer into a desired final pattern of the top layer corresponding to the device, thereby exposing selected areas of the middle layer around the desired final pattern; and
(d) etching from the top side the exposed areas of the middle layer,
thereby providing the device for micromanipulating objects.

11. The method of claim 10, wherein said wafer is a silicon-on-insulator wafer, wherein said middle layer is a buried insulating layer between a top device silicon layer and a bottom handle silicon layer.

12. A method for grasping and placing an object to a desired target area with the use of a device capable of manipulating nanometer-sized objects or micrometer-sized objects, said device comprising gripping arms capable of opening and closing around the object, a movable active release plunger to impact or push the object adhered to the gripping arms, and microactuation means connected to the gripping arms and the active plunger and operable to actuate said gripping arms and to actuate the movable active release plunger, wherein the method comprises the following steps:
(a) closing the gripping arms around the object to grasp;
(b) moving the device to lift the object up and transport the object to the desired target area;
(c) opening the gripping arms; and
(d) activating the plunger to actively release the object attached by adhesion forces to an arm of the gripping arms thereby placing the object on the target area.

13. The method for grasping and placing an object to a desired target area of claim 12, wherein said microactuation means are independently connected to the gripping arms and to the active release plunger thereby allowing flexible alignment between the gripping arm to which the object is attached and the plunger.

* * * * *